United States Patent [19]

Miyaki et al.

[11] Patent Number: 5,604,759
[45] Date of Patent: Feb. 18, 1997

[54] DRIVE CIRCUIT FOR ELECTRONIC DEVICE

[75] Inventors: Yuji Miyaki; Michikazu Shima, both of Kawasaki, Japan

[73] Assignee: Fujitsu Limited, Kanagawa, Japan

[21] Appl. No.: 10,285

[22] Filed: Jan. 28, 1993

[30] Foreign Application Priority Data

Jan. 30, 1992 [JP] Japan .................................. 4-015534

[51] Int. Cl.⁶ .................................................. H01S 3/103
[52] U.S. Cl. .............................. 372/38; 372/36; 372/28; 372/26
[58] Field of Search ................................ 372/36, 26, 28, 372/38; 363/41; 318/293; 323/288

[56] References Cited

U.S. PATENT DOCUMENTS

| | | | |
|---|---|---|---|
| 4,514,666 | 4/1985 | Suzuki | 318/293 |
| 4,594,541 | 6/1986 | Schott | 323/288 |
| 4,816,726 | 3/1989 | Novis et al. | 318/293 |
| 5,021,936 | 6/1991 | Nishizawa et al. | 363/41 |
| 5,287,372 | 2/1994 | Ortiz | 372/38 |

FOREIGN PATENT DOCUMENTS

| | | |
|---|---|---|
| 0135190 | 3/1985 | European Pat. Off. . |
| 0308358 | 3/1989 | European Pat. Off. . |
| 61-158068 | 7/1986 | Japan . |
| 9112703 | 8/1991 | WIPO . |

*Primary Examiner*—Brian Healy
*Assistant Examiner*—Robert McNutt

[57] ABSTRACT

A drive circuit drives an electronic device that converts electric power into light or heat energy. The drive circuit has a switch connected to the electronic device in series, and a control circuit for providing, in response to an input control signal, a pulse modulation signal for controlling the switch. The frequency of the pulse modulation signal is higher than the response frequency of the electronic device. Alternatively, the drive circuit may have first to fourth switches disposed on both sides of the electronic device, for passing a current in different directions through the electronic device, and a control circuit for controlling the switches to change the direction and magnitude of the average of the current flowing through the electronic device in response to an input control signal.

6 Claims, 20 Drawing Sheets

5,604,759

DRIVE CIRCUIT FOR ELECTRONIC DEVICE

BACKGROUND OF THE INVENTION

1. Field of the Invention

The present invention relates to a circuit for driving an electronic device, and particularly, to a circuit for driving an electronic device that converts electric power into light or heat energy.

2. Description of the Related Art

Examples of electronic devices that convert electric power into light or heat energy are direct-current driven laser diodes such as pump laser diodes for optical fiber amplifiers, and Peltier elements. These devices require a high-output drive circuit, which must be compact and operate on low power.

Conventional drive circuits for the laser diodes and Peltier elements usually employ an analog control circuit composed of one or more bipolar transistors or field effect transistors (FETs). The analog control circuit is connected to a power source and provides the laser diode or Peltier element with a drive current. Each bipolar transistor or FET of the analog control circuit always consumes a product of the drive current and a voltage applied to both ends of the transistor. This large power consumption deteriorates the efficiency of the drive circuit, requires a high voltage to be applied to the ends of each transistor, increases the size of each transistor, and decreases the space factor of the drive circuit.

SUMMARY OF THE INVENTION

An object of the present invention is to provide a compact and power saving drive circuit for an electronic device.

A drive circuit according to a first aspect of the present invention involves an electronic device for converting electric power into light or heat energy, a switch connected to the electronic device in series, and a control circuit for providing, in response to an input control signal, a pulse modulation signal for controlling the switch, the frequency of the pulse modulation signal being higher than the response frequency of the electronic device.

A drive circuit according to a second aspect of the present invention involves an electronic device for converting electric power into light or heat 10 energy, a switch connected to the electronic device in series, a control circuit for controlling the switch with a pulse modulation signal for the electronic device in response to an input control signal, an inductor connected at least to an end of the electronic device in series, and a catch diode for feeding energy accumulated in the inductor back to a power source circuit along a route through the electronic device when the switch is turned OFF.

A drive circuit according to a third aspect of the present invention involves an electronic device for converting electric power into light or heat energy, first, second, third, and fourth switches disposed on both sides of the electronic device, for passing a current in opposite directions through the electronic device, and a control circuit for controlling the switches to change the direction and magnitude of the average of the current flowing through the electronic device in response to an input control signal.

Other features and advantages of the invention will be apparent from the following description with reference to the accompanying drawings.

DESCRIPTION OF THE PREFERRED EMBODIMENTS

For a better understanding of the preferred embodiments of the present invention, the problems of prior arts will be explained with reference to the drawings.

Figure 1:
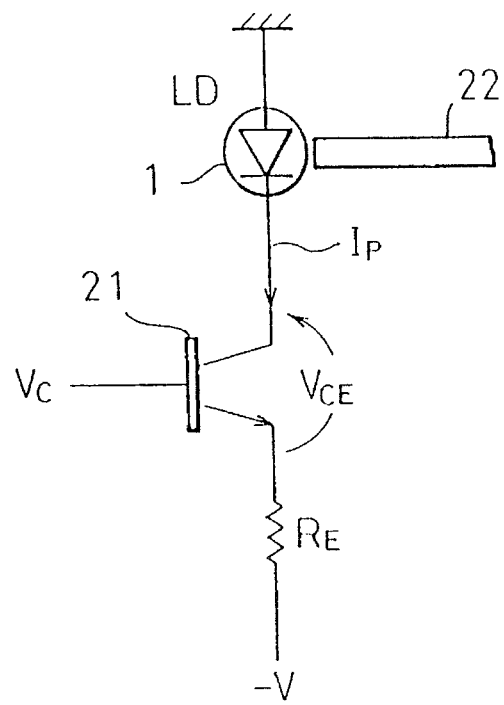
FIG. 1 is a circuit diagram showing a drive circuit for an electronic device, according to a prior art.
Figure 2:
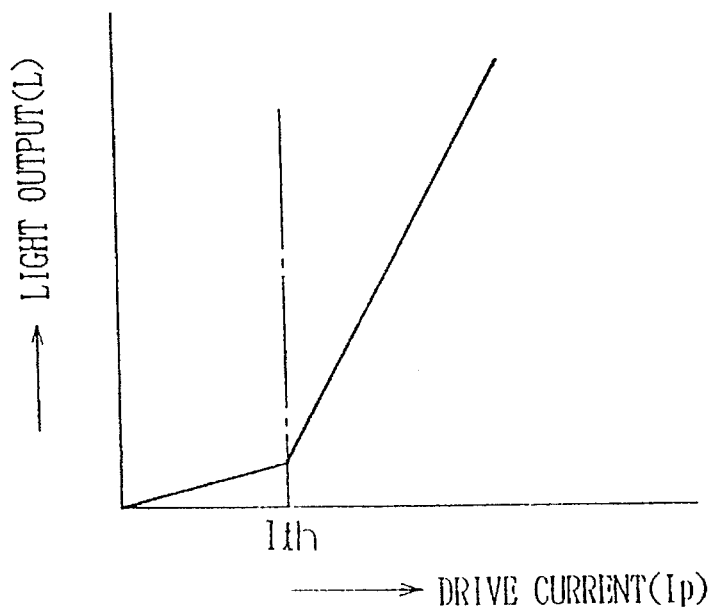
FIG. 2 is a view showing the characteristics of a laser diode.

FIG. 1 shows a drive circuit according to a prior art. This drive circuit drives a pump laser diode of an optical fiber amplifier. FIG. 2 shows the I-L characteristics of the laser diode. This drive circuit involves the laser diode (LD) 1, a bipolar transistor (or a field effect transistor (FET)) 21, and an optical fiber 22.

To emit a required light beam, the laser diode 1 must receive a relatively large drive current $I_P$. The drive current $I_P$ is analogically controlled by the bipolar transistor (or FET) 21 in response to an input analog control voltage $V_C$. The transistor 21 of the analog control system always consumes electric power of "$I_P \times V_{CE}$." To cover this power consumption, a power source voltage must be high, and the bipolar transistor (or FET) must be of large power. This results in deteriorating the efficiency and space factor of the drive circuit.

Figure 3:
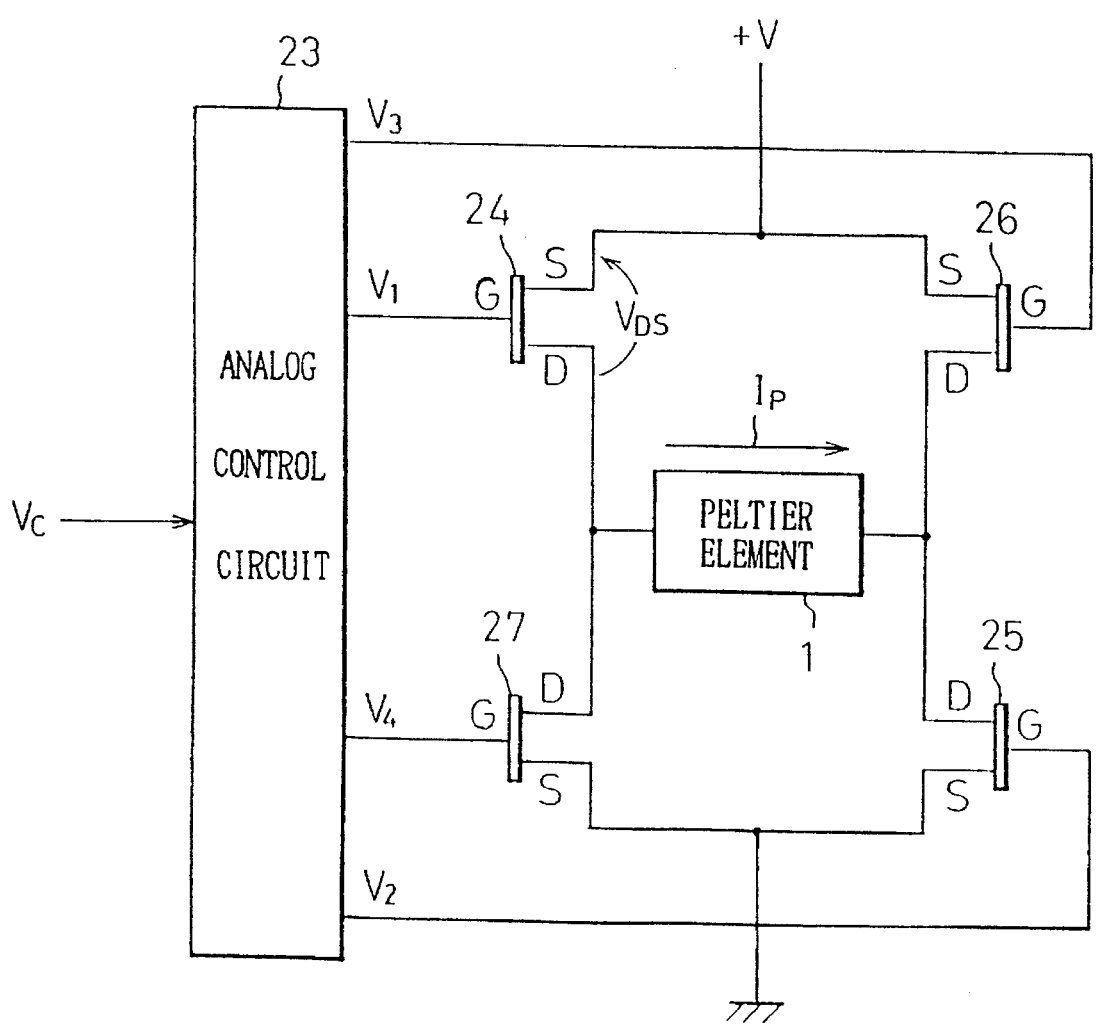
FIG. 3 is a circuit diagram showing a drive circuit according to another prior art.

FIG. 3 shows another conventional drive circuit. This circuit drives a Peltier element 1. The drive circuit includes an analog control circuit 23, P-channel MOSFETs 24 and 26, and N-channel MOSFETs 25 and 27.

Figure 4:
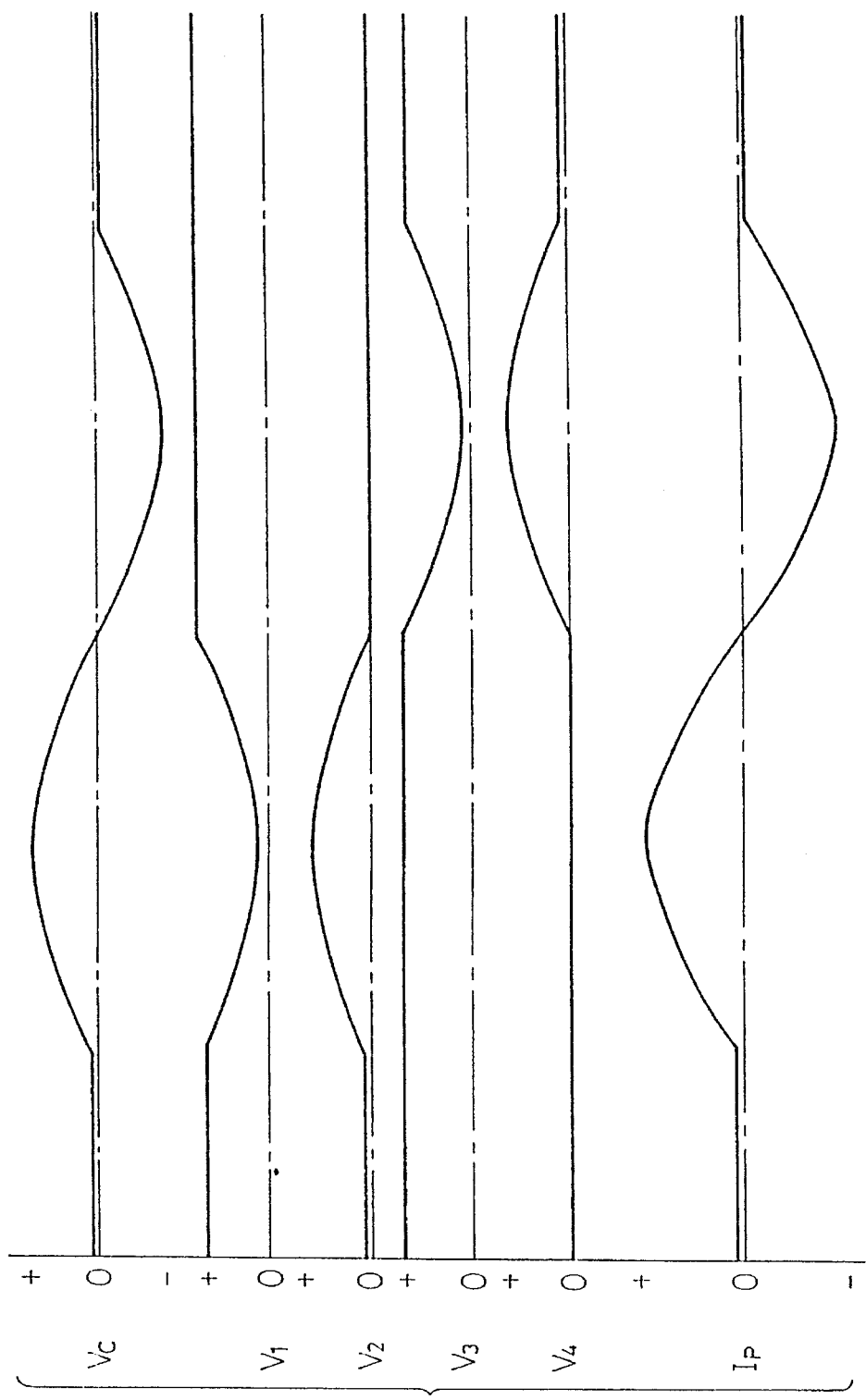
FIG. 4 is a view explaining the operation of the drive circuit of FIG. 3.

FIG. 4 explains the operation of the drive circuit of FIG. 3. When an input analog control voltage $V_C$ rises to a power source voltage +V, an output analog control voltage $V_1$ falls from the voltage +V to zero, and an analog control voltage $V_2$ rises from zero to the voltage +V. Consequently, the FETs 24 and 25 become conductive to pass a drive current $I_P$ in a positive direction through the Peltier element 1, thereby heating the Peltier element 1.

When the input voltage $V_C$ falls below zero, an output analog control voltage $V_3$ falls from the voltage +V to zero, and an analog control voltage $V_4$ rises from zero to the voltage +V. Consequently, the FETs 26 and 27 become conductive to pass the drive current $I_P$ in a reverse direction through the Peltier element 1, thereby cooling the Peltier element 1.

According to this analog control system, each conductive FET consumes electric power of "$I_P \times V_{DS}$." To cover this power consumption, a large power source voltage is required. Namely, each FET (or bipolar transistor) must be of large power. This results in deteriorating the efficiency and space factor of the drive circuit.

In this way, the conventional drive circuits analogically control a drive current flowing through an electronic device. This technique consumes large power to lower driving efficiency. Since a high power source is needed to cover the power consumption, the drive circuit must employ large-power elements, which deteriorate the space factor of the drive circuit.

Figure 5:
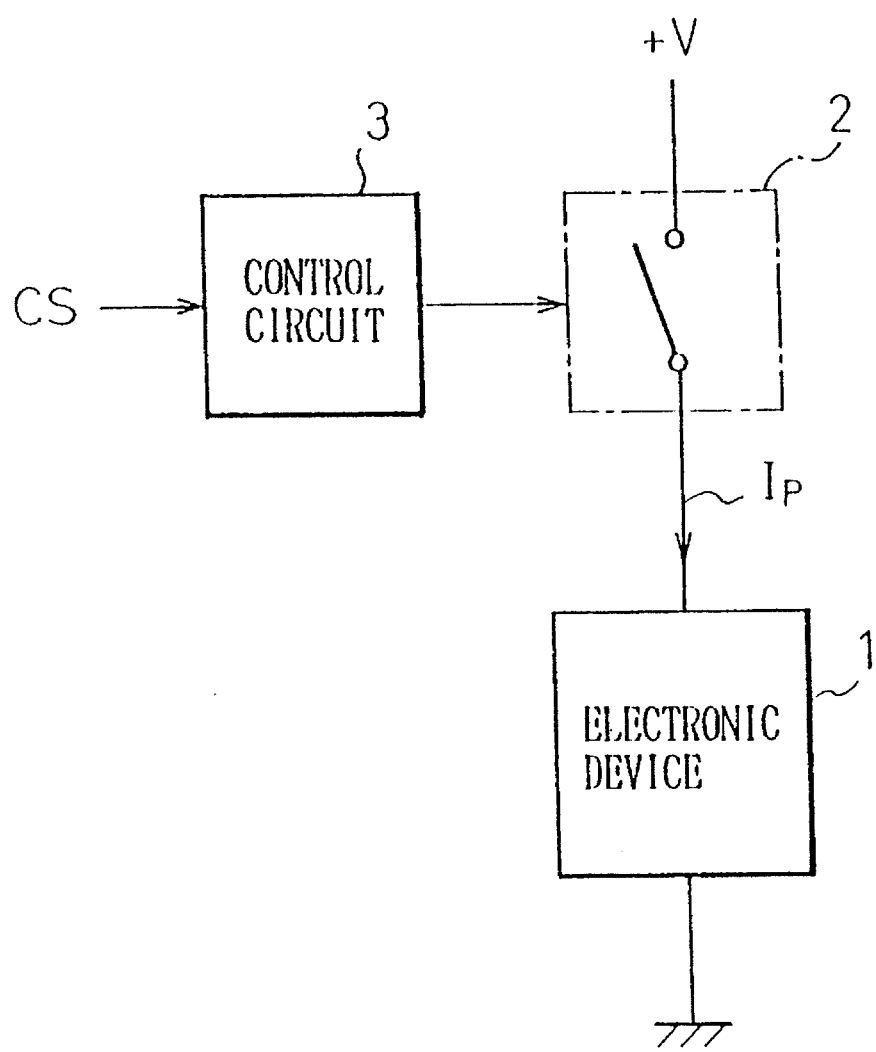
FIG. 5 is a block diagram showing a drive circuit for an electronic device, according to the first aspect of the present invention.

Next, a drive circuit for an electronic device according to the first aspect of the present invention will be explained with reference to FIG. 5.

This drive circuit involves an electronic device 1 for converting electric power into light or heat energy, a switch 2 connected to the electronic device 1 in series, and a control circuit 3 for providing, in response to an input control signal CS, a pulse modulation signal for controlling the switch 2. The frequency of the pulse modulation signal is higher than the response frequency of the electronic device 1.

The pulse modulation signal provided by the control circuit 3 in response to the control signal CS controls the switch 2 by a higher frequency than the response signal of the electronic device to change the magnitude of the average of a current flowing through the electronic device 1, thereby controlling the output of the electronic device 1. The power consumption of the switch 2 is ignorable, and therefore, a power source voltage can be low and the switch 2 can be compact.

The electronic device 1 may be a laser diode, a Peltier element, or a direct-current driven laser diode.

The pulse modulation signal may be a PWM signal, a PFM signal, or a PAM signal.

A drive circuit for an electronic device according to the second aspect of the present invention will be explained with reference to FIGS. 5 and 9.

This drive circuit involves the electronic device 1 for converting electric power into light or heat energy, a switch 2 connected to the electronic device 1 in series, a control circuit 3 for controlling the switch 2 with a pulse modulation signal for the electronic device 1 in response to an input control signal CS, an inductor 4 connected at least to an end of the electronic device 1 in series, and a catch diode 5 for feeding energy accumulated in the inductor 4 back to a power source circuit along a route through the electronic device 1 when the switch 2 is turned OFF.

Figure 6:
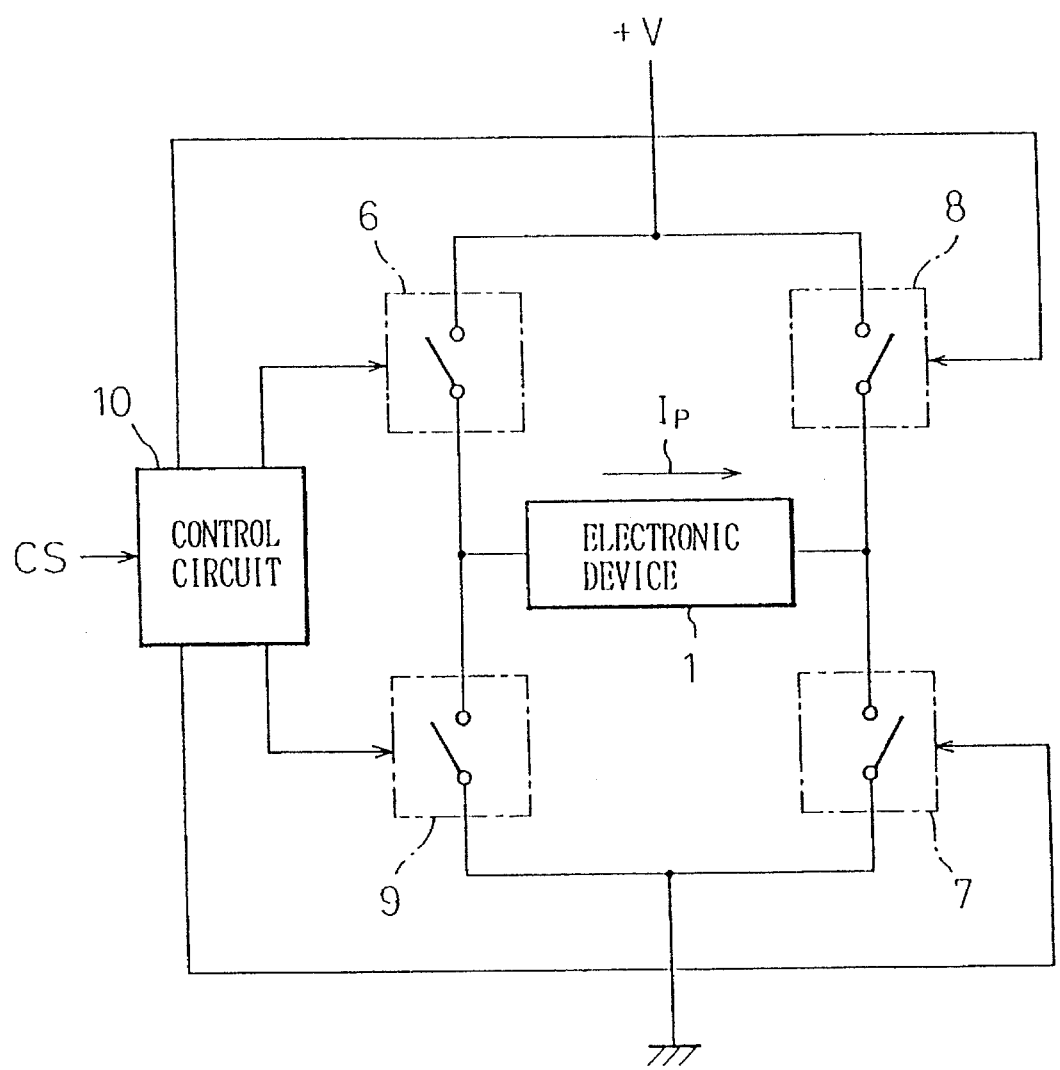
FIG. 6 is a block diagram showing a drive circuit for an electronic device, according to the third aspect of the present invention.

FIG. 6 shows a drive circuit for an electronic device according to the third aspect of the present invention.

This drive circuit involves the electronic device 1 for converting electric power into light or heat energy, first, second, third, and fourth switches 6, 7, 8, and 9 disposed on both sides of the electronic device 1, for passing a current in different directions through the electronic device 1, and a control circuit 10 for controlling the switches 6 to 9 in response to an input control signal CS to change the magnitude and direction of the average of the current flowing through the electronic device 1.

When the control circuit 10 controls the switches 6 to 9 in response to the control signal CS to change the direction and magnitude of the average of the current passing through the electronic device 1, the switches 6 to 9 consume ignorable electricity. This results in reducing a power source voltage as well as the capacity of the switches 6 to 9.

The control circuit 10 may control the switches 6 to 9 such that a current flows in opposite directions through the electronic device 1 in response to a pulse modulation signal whose frequency is higher than the response frequency of the electronic device 1 and such that the direction and magnitude of the average of the current are changed in response to the control signal CS.

The control circuit 10 causes a current to flow in a forward or reverse direction through the electronic device 1 in response to the control signal CS, and controls the two parts of switches 6, 7 and 8, 9 to change the direction and magnitude of the average of the current in response to a pulse modulation signal whose frequency is higher than the response frequency of the electronic device 1.

Figure 16:
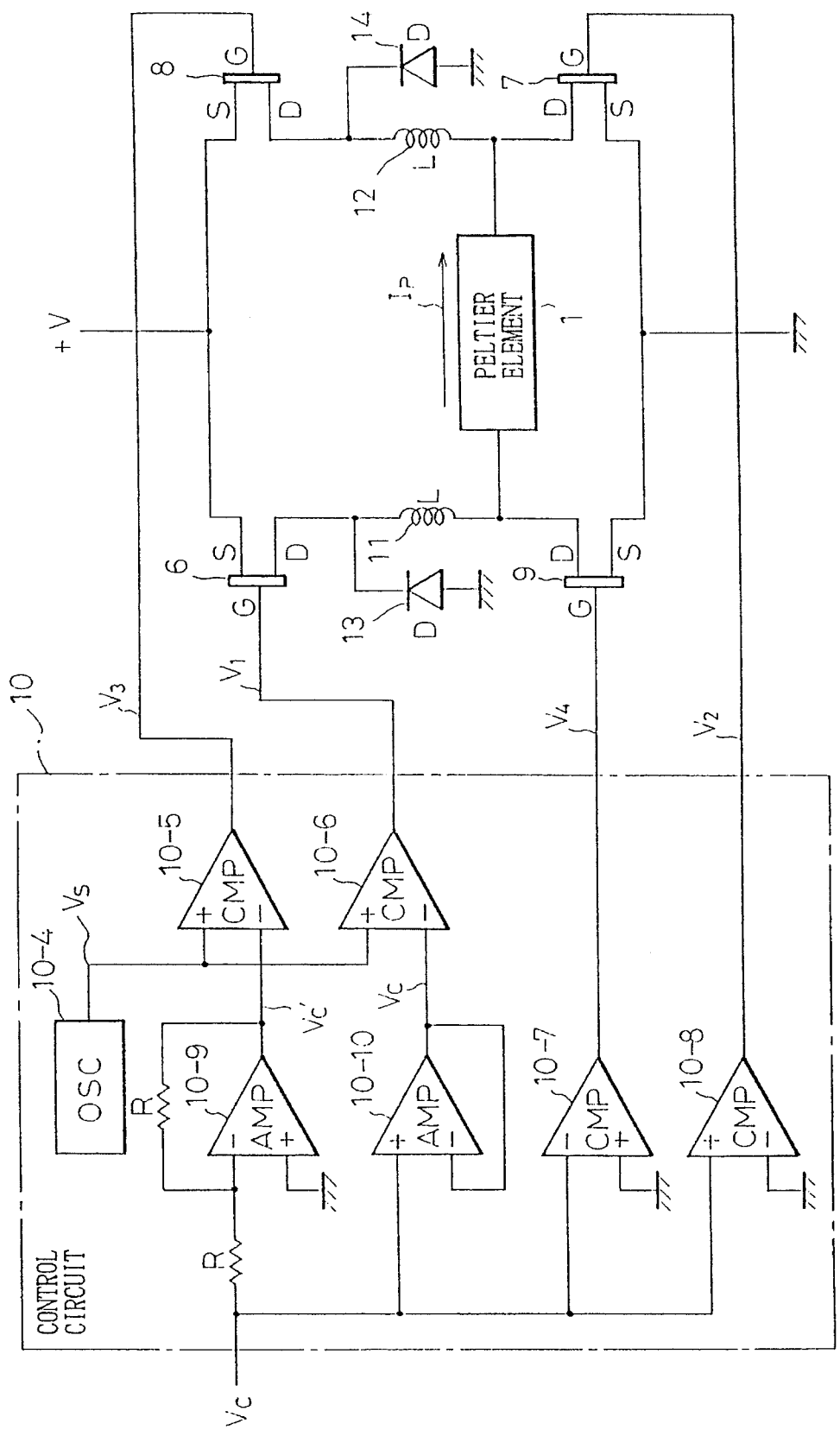
FIG. 16 is a circuit diagram showing a drive circuit for an electronic device, according to a fifth embodiment of the present invention.

As shown in FIG. 16, the drive circuit may have inductors 11 and 12 connected among the switches 6 or 7 and 8 or 9 in series, and catch diodes 13 and 14 for feeding energy accumulated in the inductors 11 and 12 back to a power source circuit along a route through the electronic device 1 when the two parts of switches 6, 7 and 8, 9 are turned OFF.

Figure 19:
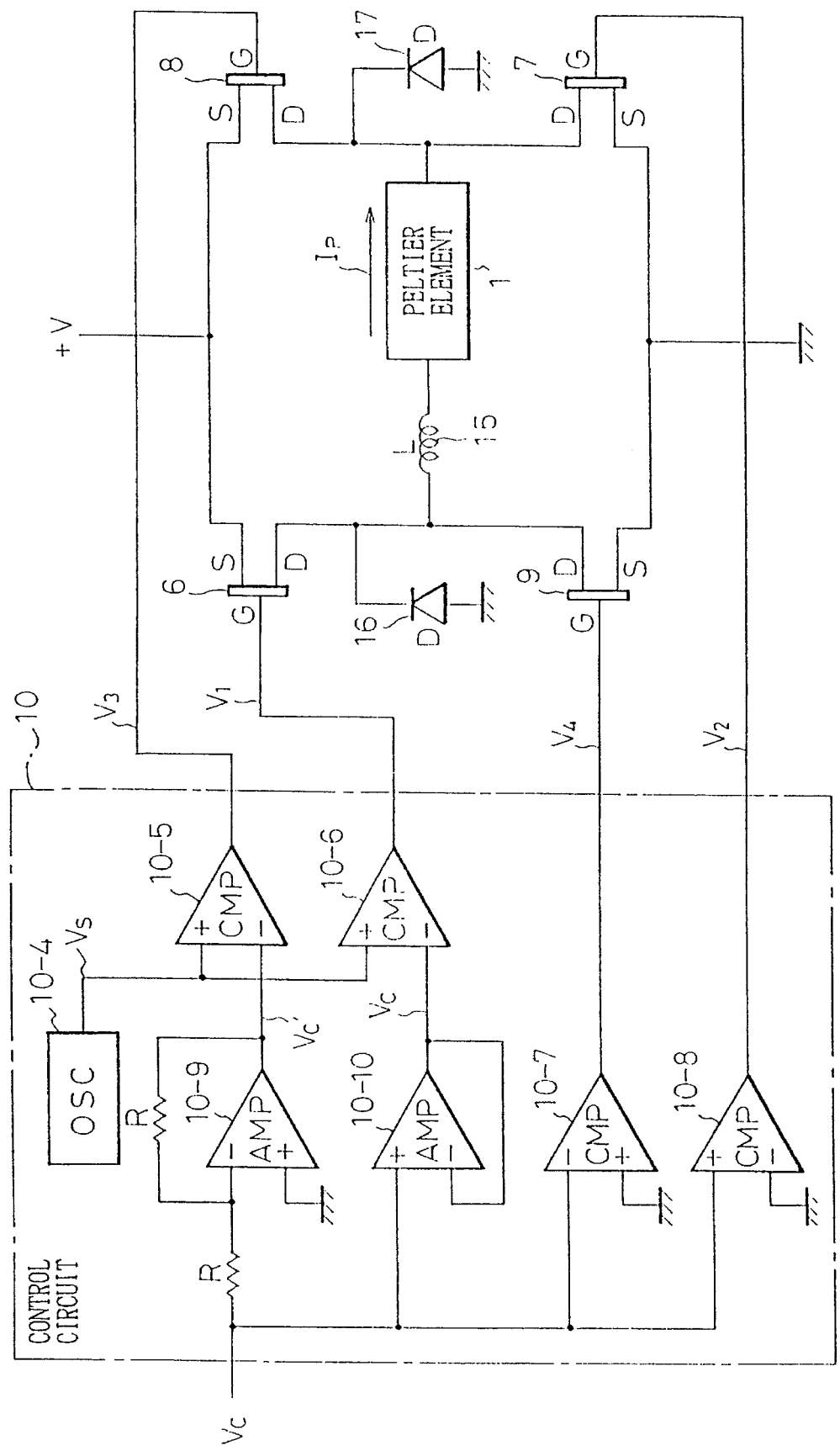
FIG. 19 is a circuit diagram showing a drive circuit for an electronic device, according to a sixth embodiment of the present invention.

As shown in FIG. 19, the drive circuit may have an inductor 15 connected at least to an end of the electronic device 1 in series, and catch diodes 16 and 17 for feeding energy accumulated in the inductor 15 back to a power source circuit along a route through the electronic device 1 when a primarily acting one of the switches 6 to 9 is turned OFF.

The electronic device 1 may be a Peltier element.

The pulse modulation signal may be a PWM signal, a PFM signal, or a PAM signal.

Preferred embodiments of the present invention will be explained in detail with reference to the drawings. Like reference marks represent like parts through the drawings.

Figure 7:
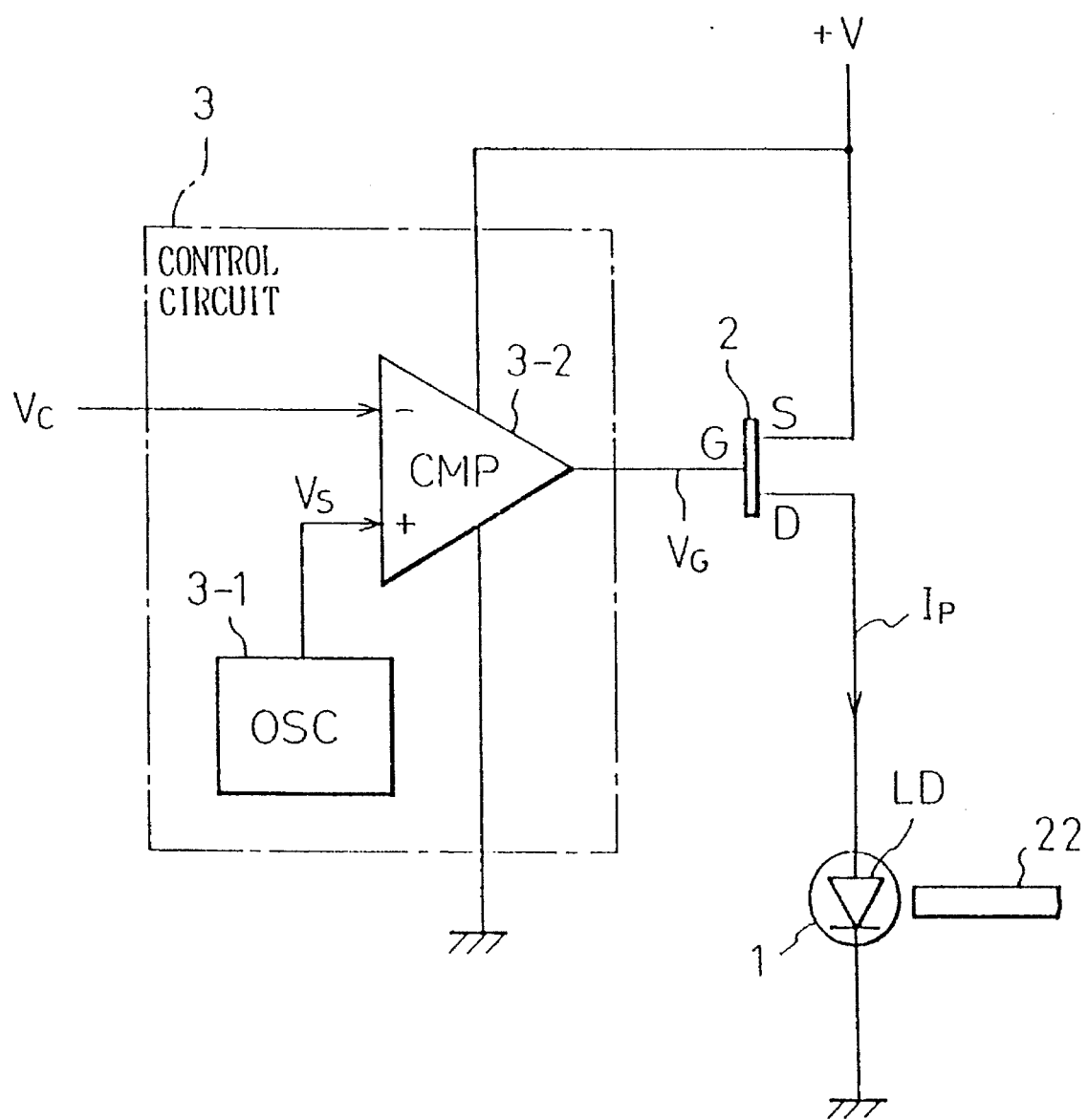
FIG. 7 is a circuit diagram showing a drive circuit for an electronic device, according to a first embodiment of the present invention.

FIG. 7 shows a drive circuit according to the first embodiment. The drive circuit includes a pump laser diode (LD) 1 for an optical fiber amplifier, a P-channel MOSFET 2, a control circuit 3, a sawtooth oscillator (OSC) 3-1 composed of a CMOS circuit operating at a frequency of, for example, 200 KHz, and a comparator (CMP) 3-2. An oscillator 10-1 to be explained later may be the same as the sawtooth oscillator 3-1.

Generally, when a pump laser for an optical fiber amplifier is modulated at about 100 KHz or over, the strength of a primary beam amplified by the optical fiber amplifier is not usually influenced by quick changes in the pump laser, because of the fluorescent characteristics of optical fibers such as erbium doped fibers. A pulse modulation signal having such a high frequency, therefore, is employable for controlling the switching of the FET 2 to change the magnitude of the average of a current flowing through the laser diode 1. This results in analogically controlling the the laser diode 1. This results in analogically controlling the optical output of the laser diode 1.

Figure 8:
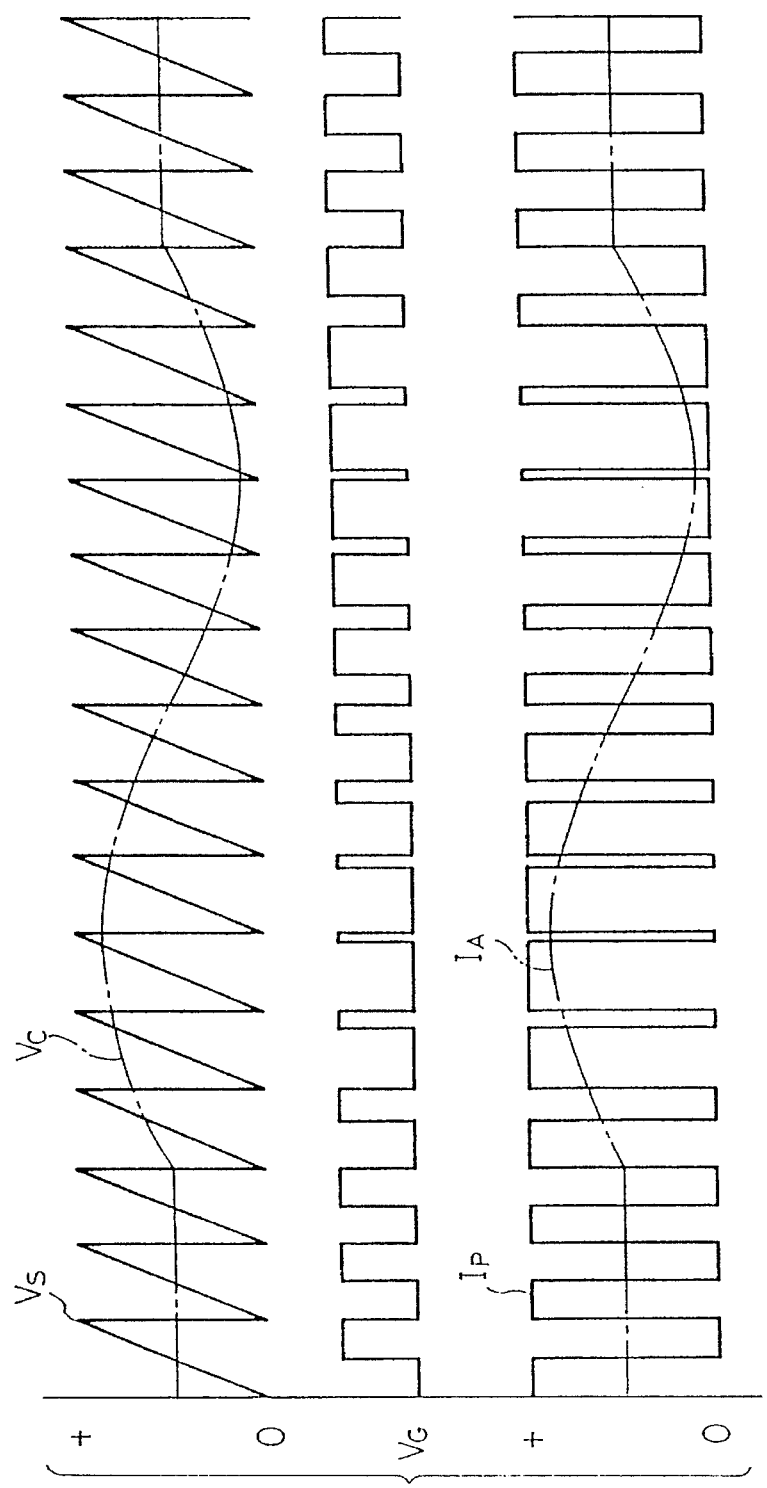
FIG. 8 is a timing chart showing the operation of the drive circuit of FIG. 7.

FIG. 8 is a timing chart showing the operation of the drive circuit of FIG. 7. The comparator 3-2 compares an input analog control voltage $V_C$ with a sawtooth signal $V_S$ from the sawtooth oscillator 3-1, and provides a PWM signal $V_G$, which is positive when $V_S > V_C$. When the gate voltage $V_G$ is zero, the P-channel MOSFET 2 forms a P channel to provide a drive current $I_P$. When the gate voltage $V_G$ is positive, the P channel is not formed, and the drive current $I_P$ is not provided. Namely, the FET 2 provides the drive current $I_P$ in response to the pulse width of an inversion of the PWM signal $V_G$. The average $I_A$ of the drive current $I_P$ analogically changes as shown in FIG. 8. Consequently, the optical output of the pump laser diode 1 for the optical fiber amplifier is analogically controlled.

Although this embodiment provides a PWM signal in response to the input analog control voltage $V_C$, it may provide a PFM signal. For example, a pulse width at which the gate voltage $V_G$ is zero is fixed, and when the control voltage $V_C$ exceeds an intermediate level, the frequency of the gate voltage $V_G$ is increased to increase the average of the drive current $I_P$. When the control voltage $V_C$ falls below the intermediate level, the frequency of the gate voltage $V_G$ is decreased to lower the average of the drive current $I_P$. Alternatively, a power source voltage +V may be changed according to the control voltage $V_C$ to provide a PAM signal.

Figure 9:
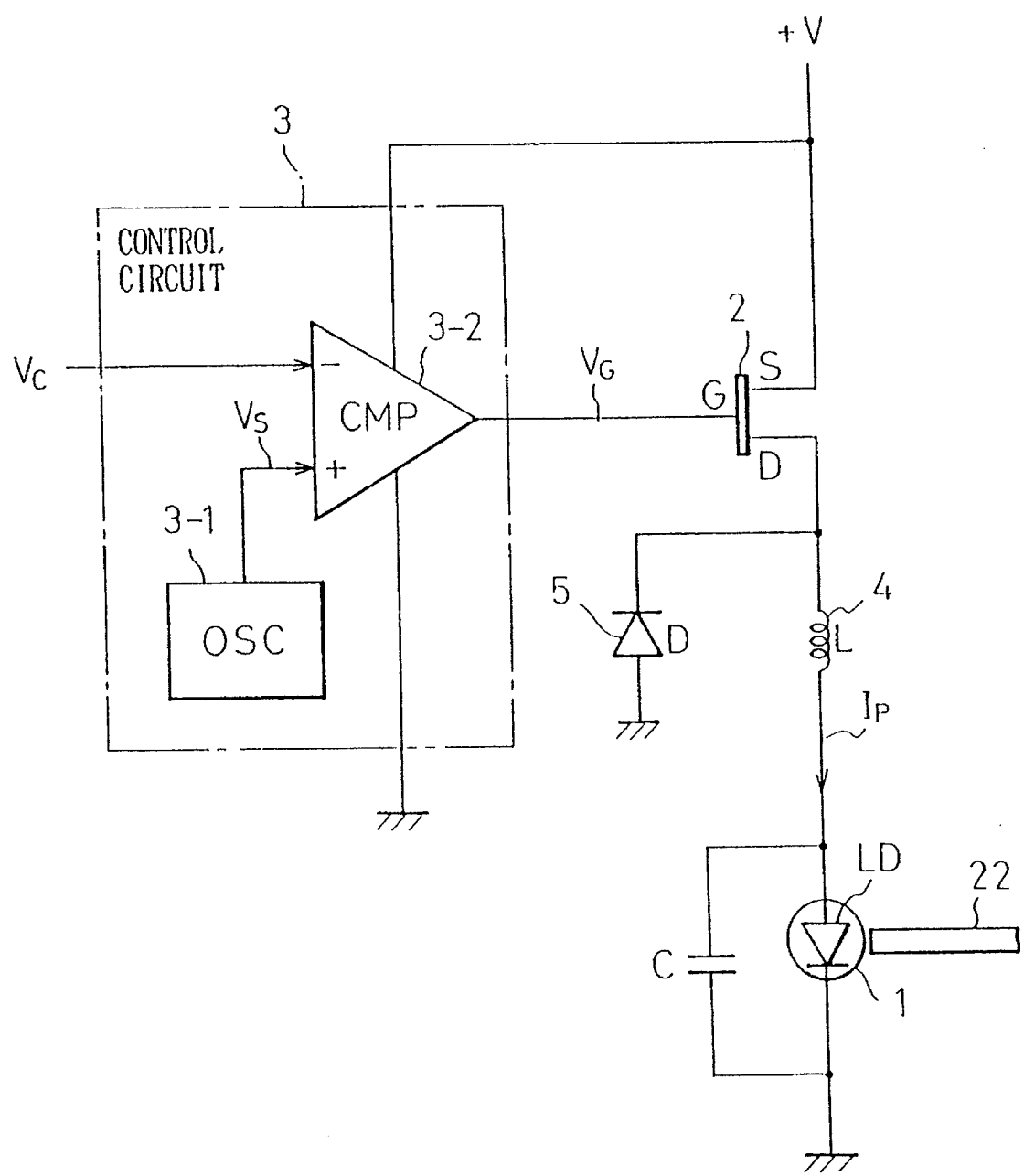
FIG. 9 is a circuit diagram showing a drive circuit for an electronic device, according to a second embodiment of the present invention.

FIG. 9 shows a drive circuit according to the second embodiment of the present invention. This drive circuit includes an inductor (L) 4, a catch diode (D) 5, and a higher harmonics blocking capacitor C.

When a FET 2 is turned ON, a drive current $I_P$ flows to a laser diode 1 through the inductor 4. When the FET 2 is turned OFF, the inductor 4 discharges accumulated energy, and therefore, the drive current $I_P$ continuously flows to the laser diode 1 through the catch diode 5.

The inductor 4 may be disposed on the cathode side of the laser diode 1, or divided into two and disposed on the anode and cathode sides of the laser diode 1, respectively.

Figure 10:
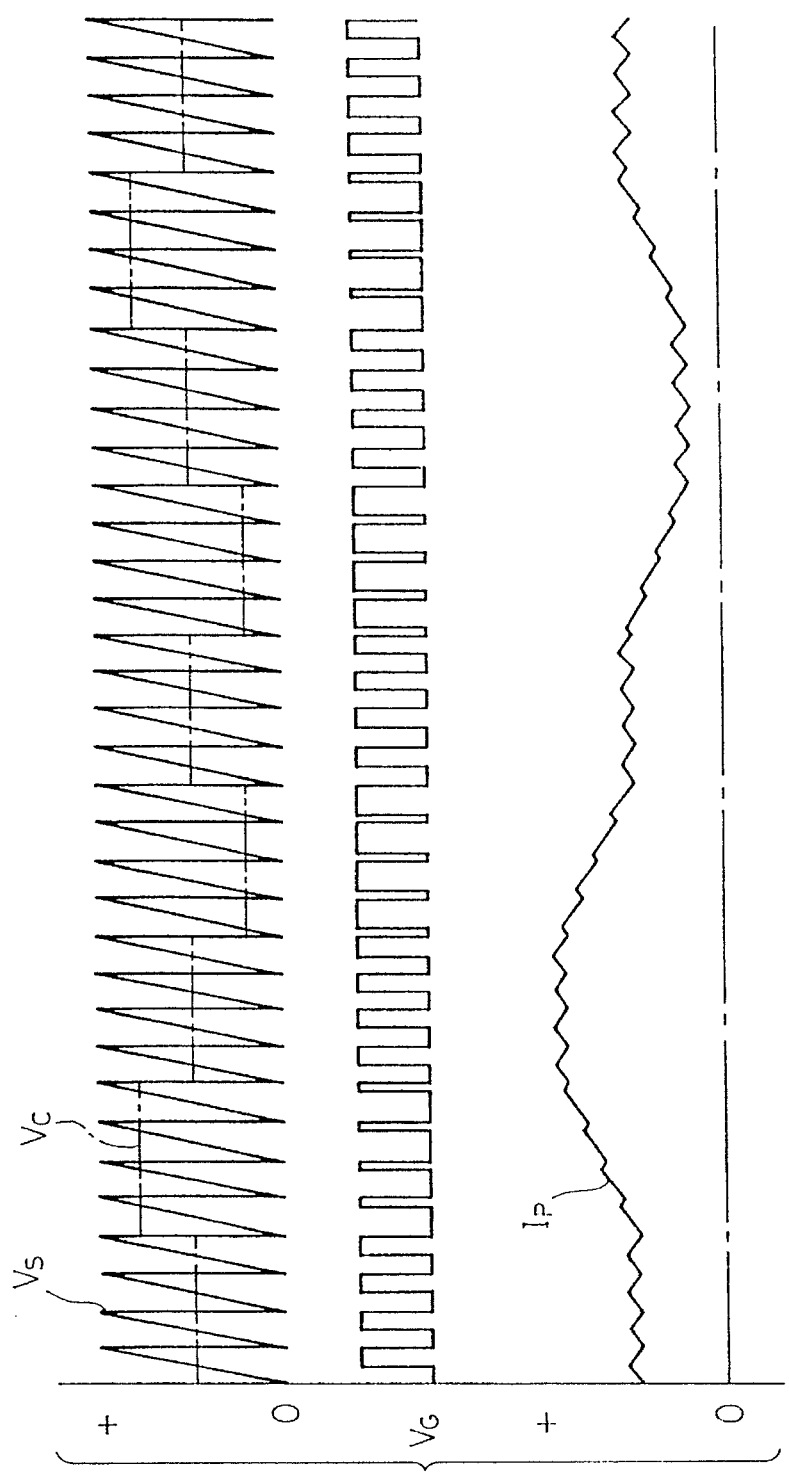
FIG. 10 is a timing chart showing the operation of the drive circuit of FIG. 9.

FIG. 10 is a timing chart showing the operation of the drive circuit of FIG. 9. The drive current $I_P$ becomes smoother because it continuously flows to the laser diode 1 even while the FET 2 is OFF. Compared with the first embodiment that directly drives the laser diode 1 with the pulse current $I_P$ that alternates between positive and negative states, the second embodiment further suppresses fluctuations in the light output of the laser diode 1. Since FET 2 is not always subjected to the maximum current, the FET 2 of the second embodiment can be more compact.

Figure 11:
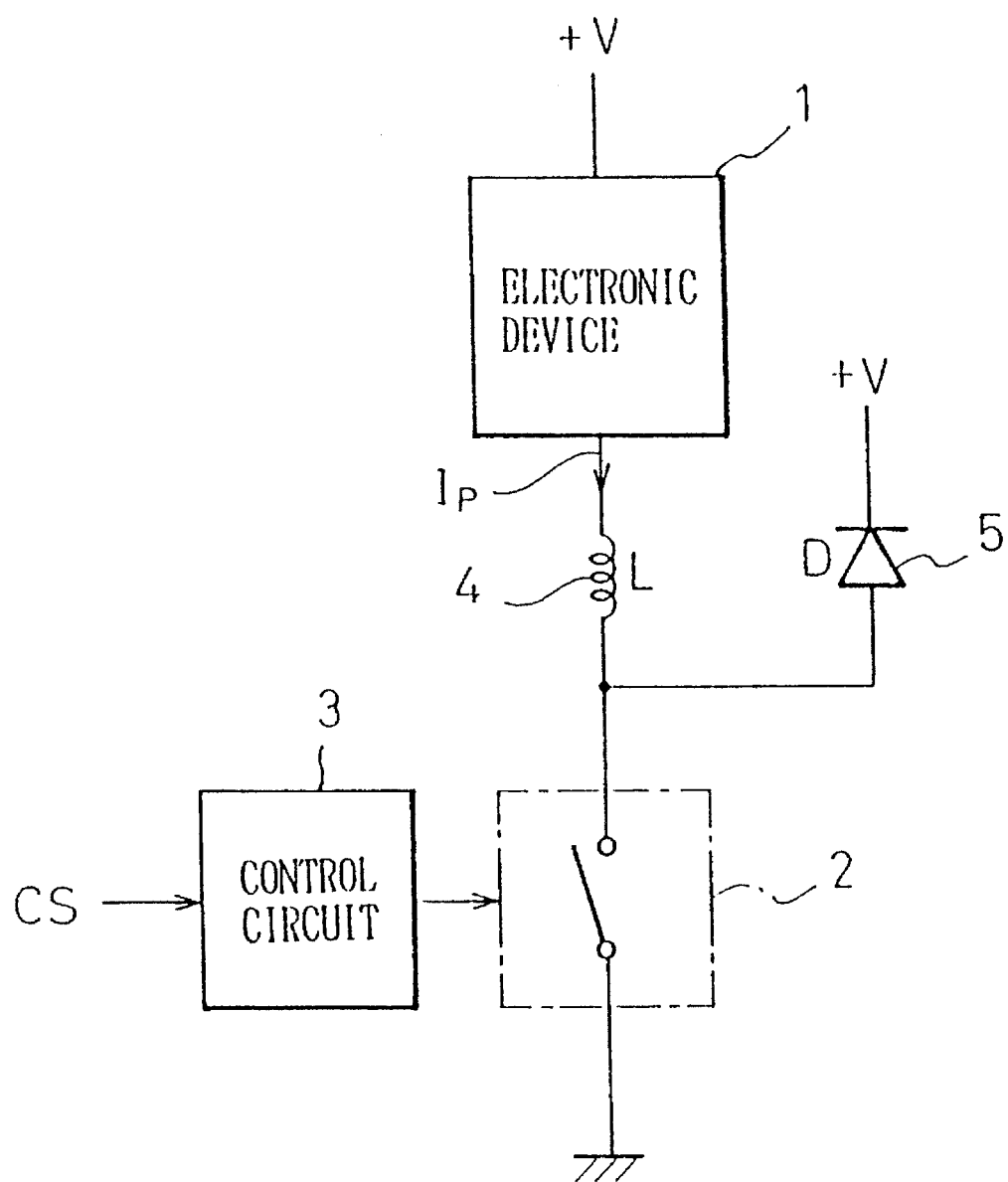
FIG. 11 is a circuit diagram showing another drive circuit according to the second embodiment.

FIG. 11 shows a drive circuit according to a modification of the second embodiment. The positions of an electronic device 1 and a switch 2 with respect to a power source are opposite to those of the second embodiment.

When the switch 2 is turned ON, a drive current $I_P$ flows through the electronic device 1 and an inductor 4. When the switch 2 is turned OFF, the inductor 4 discharges accumulated energy, and therefore, the drive current $I_P$ continuously flows through the electronic device 1 via a catch diode 5.

In this way, the second embodiment of the present invention allows various modifications.

The electronic device 1 may be a Peltier element instead of the laser diode. In this case, the temperature of the Peltier element is controlled in one way.

Figure 12:
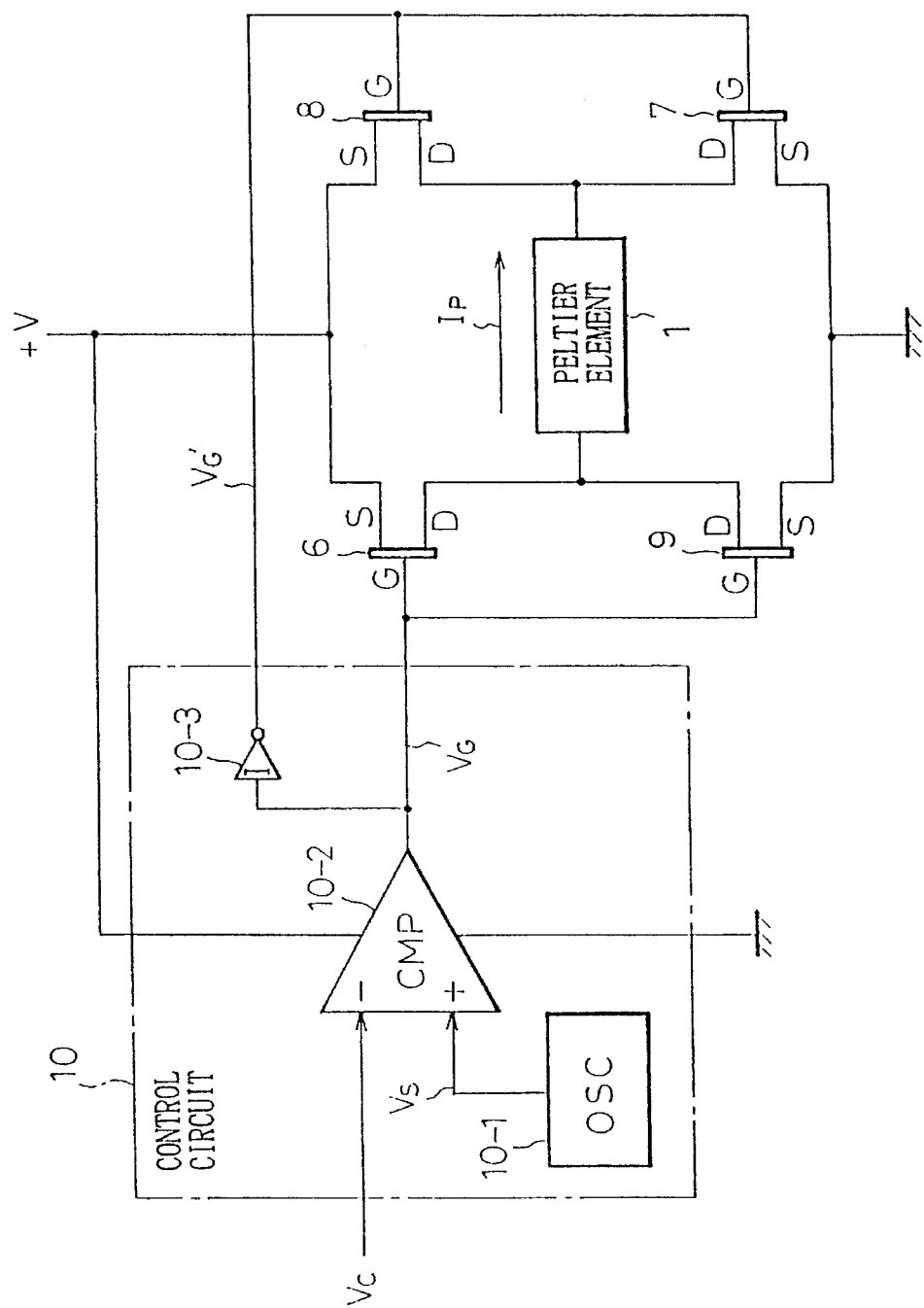
FIG. 12 is a circuit diagram showing a drive circuit for an electronic device, according to a third embodiment of the present invention.

FIG. 12 shows a drive circuit according to the third embodiment of the present invention. This circuit involves a Peltier element 1, a control circuit 10, a sawtooth oscillator 10-1 composed of a CMOS circuit having a frequency of, for example, 200 KHz, a comparator (CMP) 10-2, an inverter (I) 10-3, P-channel MOSFETs 6 and 8, and N-channel MOSFETs 7 and 9.

The comparator 10-2 compares an input analog control voltage $V_C$ with a sawtooth signal $V_S$ from the sawtooth oscillator 10-1, and provides a PWM signal $V_G$ and an inverted signal $V_G'$. The PWM signal $V_G$ is positive when $V_S > V_C$.

When the $V_G$ is zero, the FET 6 is ON and the FET 9 is OFF. At this time, the inverted signal $V_G'$ is positive, and therefore, the FET 8 is OFF and FET 7 is ON. As a result, a current $I_P$ flows in a forward direction through the Peltier element 1.

When the signal $V_G$ is positive, the FET 6 is OFF and FET 9 is ON. At this time, the inverted signal $V_G'$ is zero, and therefore, the FET 8 is ON and the FET 7 is OFF. As a result, the current $I_P$ flows in a reverse direction through the Peltier element 1.

Figure 13:
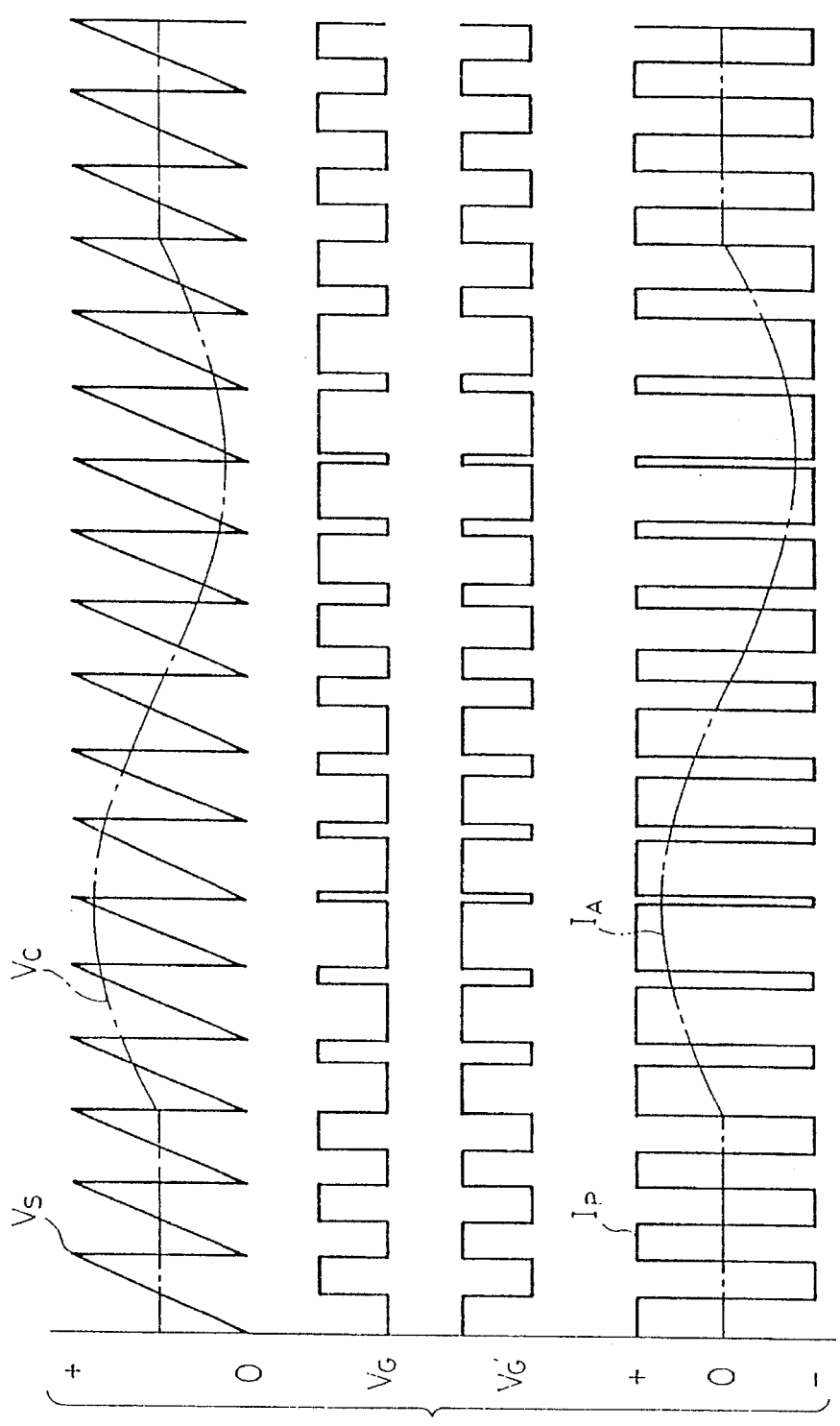
FIG. 13 is a timing chart showing the operation of the drive circuit of FIG. 12.

FIG. 13 is a timing chart showing the operation of the drive circuit of FIG. 12.

When the input analog control voltage $V_C$ is at an intermediate level, the PWM signal $V_G$ achieves a positive duty ratio of 50%. Accordingly, the current $I_P$ equally flows in both directions through the Peltier element 1, and therefore, the average $I_A$ of the current $I_P$ is zero. Namely, the Peltier element 1 is equally heated and cooled to balance the temperature thereof.

When the control voltage $V_C$ exceeds the intermediate level, the positive duty ratio of the PWM signal $V_G$ decreases, while the positive duty ratio of the inverted signal $V_G'$ increases. As a result, the current $I_P$ flows in the forward direction for a longer time through the Peltier element 1, to heat the Peltier element 1.

When the control voltage $V_C$ drops below the intermediate level, the positive duty ratio of the PWM signal $V_G$ increases, and the positive duty ratio of the inverted signal $V_G'$ decreases. As a result, the current $I_P$ flows in the reverse direction for a longer time through the Peltier element 1, to cool the Peltier element 1.

Figure 14:
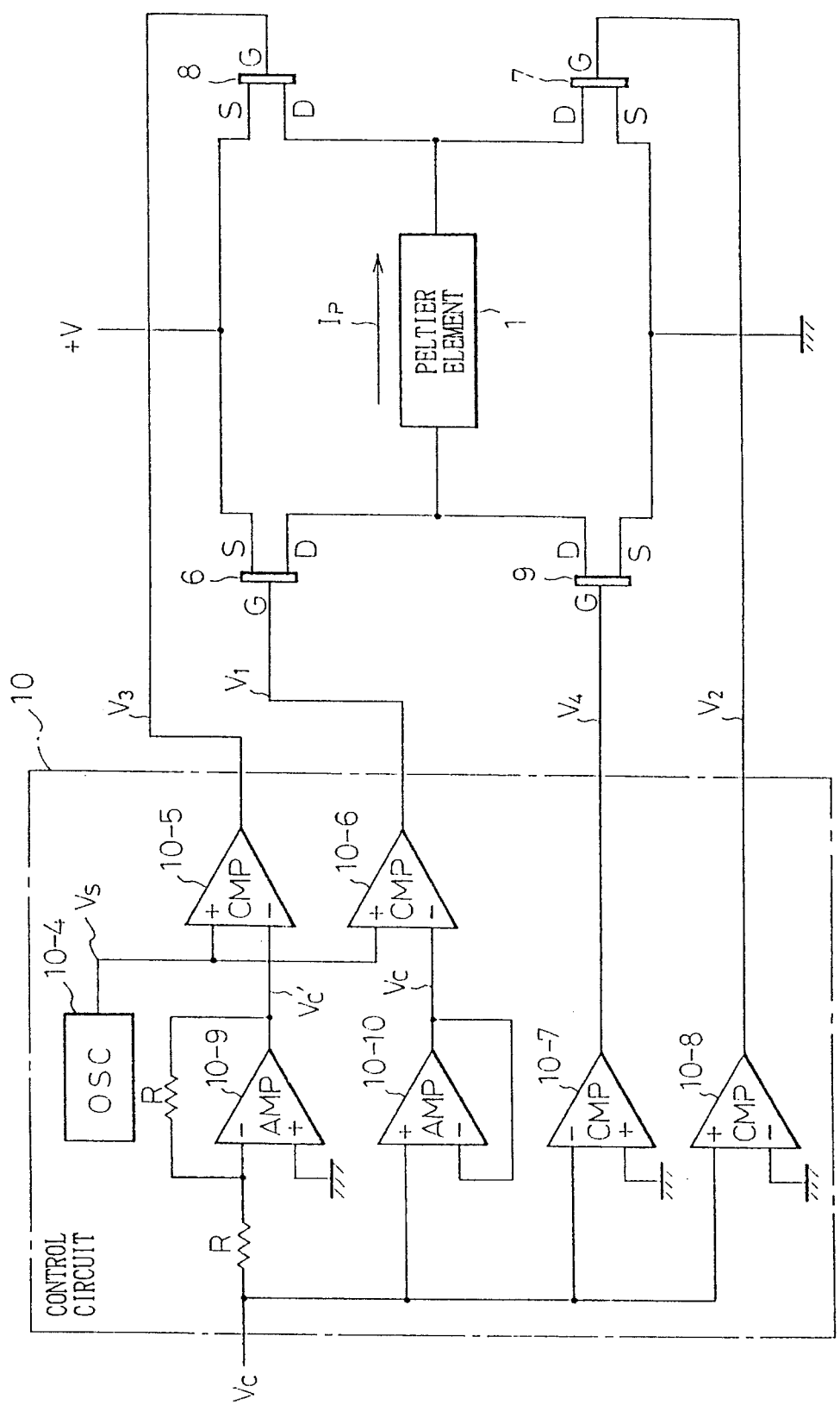
FIG. 14 is a circuit diagram showing a drive circuit for an electronic device, according to a fourth embodiment of the present invention.

FIG. 14 shows a drive circuit according to the fourth embodiment of the present invention. This circuit includes a Peltier element 1, a control circuit 10, a sawtooth oscillator 10-4, comparators (CMPs) 10-5 to 10-8, an inverting amplifier (AMP) 10-9, and a voltage follower (AMP) 10-10.

Figure 15:
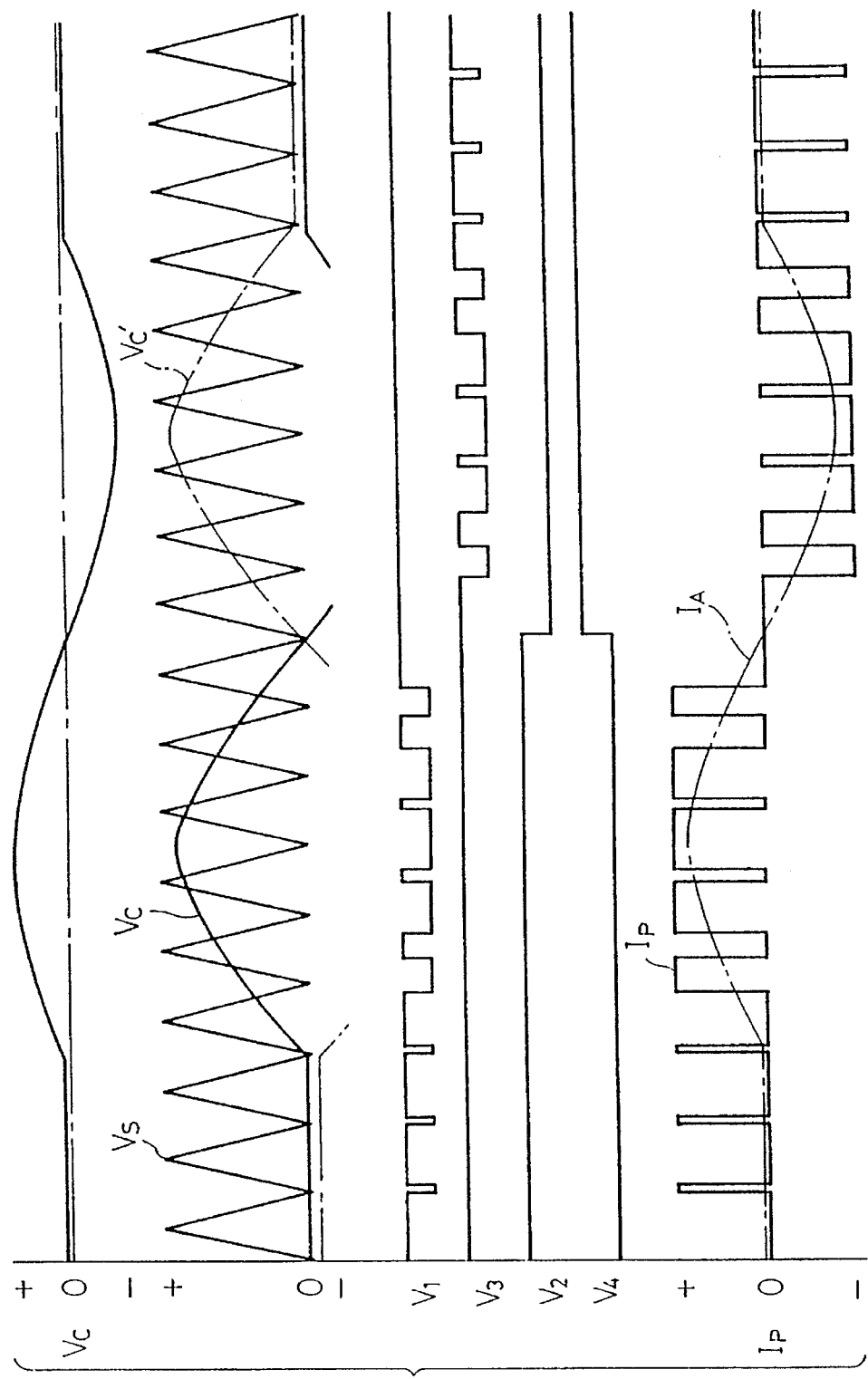
FIG. 15 is a timing chart showing the operation of the drive circuit of FIG. 14.

FIG. 15 is a timing chart showing the operation of the drive circuit of FIG. 14.

The comparator 10-8 turns ON a FET 7 when $V_C > 0$. The comparator 10-6 compares an input analog control voltage $V_C$ from the voltage follower 10-10 with a triangular signal $V_S$ from the oscillator 10-4 and provides a PWM signal $V_1$, which is zero if $V_S<V_C$. When the control voltage $V_C$ is positive and close to zero, a drive current $I_P$ slightly flows in a forward direction through the Peltier element 1.

When the control voltage $V_C$ increases, the 0V duty ratio of the PWM signal $V_1$ increases from about 0% to 100% at the maximum. As a result, the drive current $I_P$ flows in the forward direction for a longer time through the Peltier element 1. The average $I_A$ of the drive current $I_P$ flowing through the Peltier element 1, therefore, increases to heat the Peltier element 1.

When $V_C<0$, the comparator 10-7 turns ON a FET 9. The comparator 10-5 compares an inverted control voltage $V_C'$ from the inverting amplifier 10-9 with the triangular signal $V_S$ from the oscillator 10-4 and provides a PWM signal $V_3$, which is zero if $V_S<V_C'$. When the control voltage $V_C$ drops below zero, the 0 V duty ratio of the PWM signal $V_3$ increases from about 0% to 100% at the maximum. As a result, the drive current $I_P$ flows in a reverse direction for a longer time through the Peltier element 1. As a result, the average $I_A$ of the drive current $I_P$ flows in the reverse direction to cool the Peltier element 1. When the control voltage $V_C$ is negative and close to zero, the drive current $I_P$ only slightly flows in the reverse direction through the Peltier element 1.

The drive circuit according to the fourth embodiment effectively drives the Peltier element 1. In one example, an average current $(I_A)$ of one ampere flows through the Peltier element 1 when the Peltier element 1 has a resistance $(R_P)$ of two ohms, each FET has an ON resistance $(R_{ON})$ of 0.2 ohms, and a source voltage (+V) is five volts. In this case, the conventional drive circuit of FIG. 3 consumes five watts in total ($P_2$) to drive the Peltier element 1. On the other hand, the drive circuit of the fourth embodiment of FIG. 14 consumes only 2.4 watts in total ($P_1$) to drive the Peltier element 1. Namely, the drive circuit of the fourth embodiment can drive the Peltier element 1 with 48% electric power of the prior art. Although the prior art of FIG. 3 must employ a FET of about one watt class, the fourth embodiment may employ a compact FET of 0.4 watt class.

In the above embodiment, the FETs 7 and 9 are used to regulate the direction of a current, and the FETs 6 and 8 are used to turn ON and OFF the current. Instead, the FETs 6 and 8 may be used to regulate the direction of a current, and the FETs 7 and 9 may be used to turn ON and OFF the current.

FIG. 16 shows a drive circuit according to the fifth embodiment of the present invention. This circuit involves inductors (Ls) 11 and 12, and catch diodes (Ds) 13 and 14.

When a FET 6 is turned ON with a FET 7 being ON, a drive current $I_P$ flows in a forward direction through a Peltier element 1 via the coil 11. When the FET 6 is turned OFF, the coil 11 discharges accumulated energy, so that the drive current $I_P$ continuously flows in the forward direction through the Peltier element 1 via the catch diode 13.

When a FET 8 is turned ON with a FET 9 being ON, the drive current $I_P$ flows in a reverse direction through the Peltier element 1 via the inductor 12.

When the FET 8 is turned OFF, the inductor 12 discharges accumulated energy, so that the drive current Ip continuously flows in the reverse direction through the Peltier element 1 via the catch diode 14.

Figure 17:
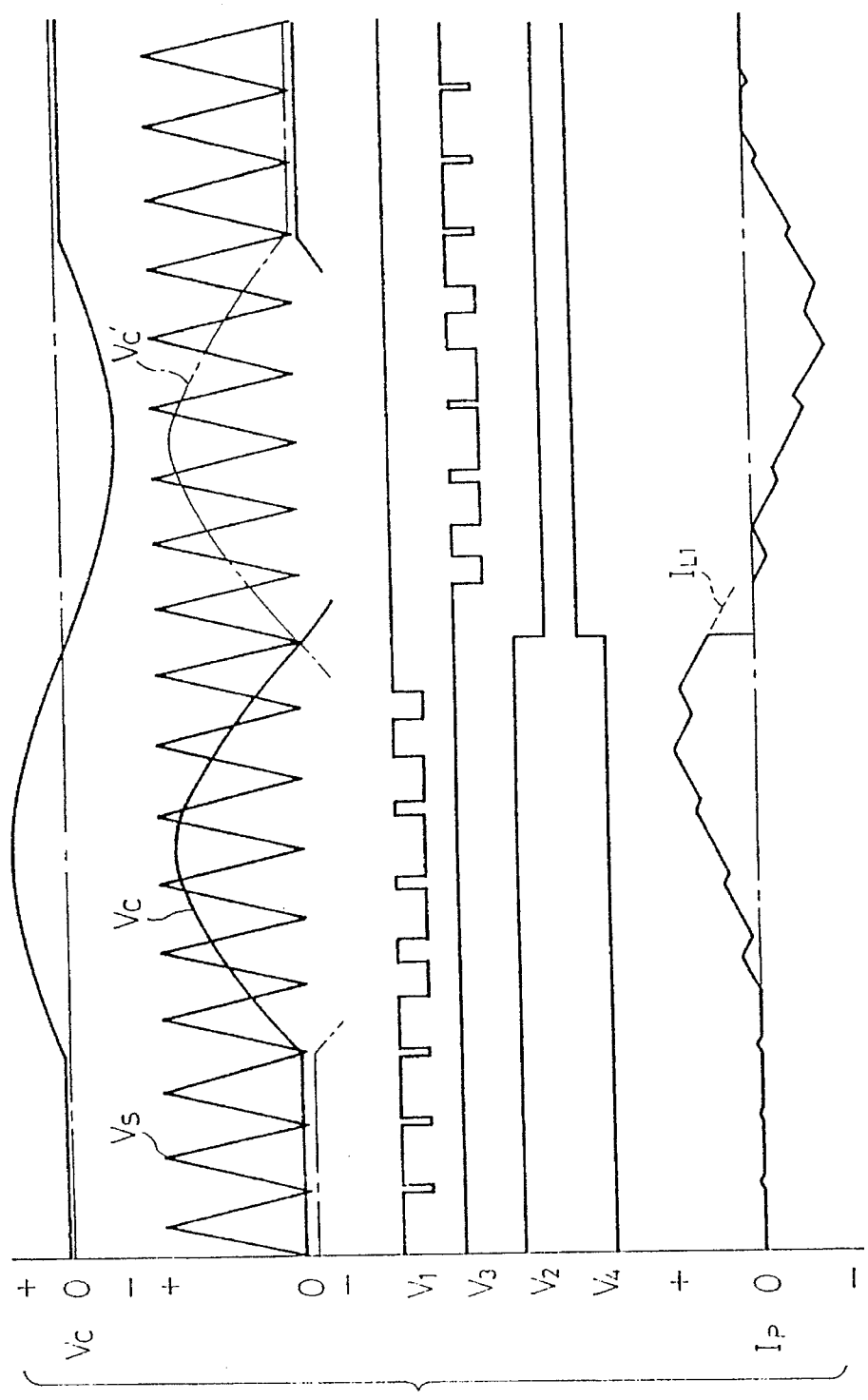
FIG. 17 is a timing chart showing the operation of the drive circuit of FIG. 16.

FIG. 17 is a timing chart showing the operation of the drive circuit of the fifth embodiment. The operation of the control circuit 10 of this embodiment is the same as that of the fourth embodiment. According to the fifth embodiment, the drive current $I_P$ continuously flows in the forward or reverse direction through the Peltier element 1 even after the FET 6 or 8 is turned OFF, to smooth the drive current $I_P$. If the FET 7 is turned OFF while the inductor 11 is discharging accumulated energy, the FET 9 is turned ON to continuously discharge the accumulated energy from the inductor 11. This is also true for the inductor 12. Accordingly, the Peltier element 1 is analogically controlled with the smoothed drive current $I_P$.

The total power consumption ($P_1$) of the drive circuit of the fifth embodiment is 2.7 watts. Namely, this drive circuit drives the Peltier element 1 with 54% electric power of the prior art. The fifth embodiment may employ a compact FET of 0.5 watt class.

Figure 18A:
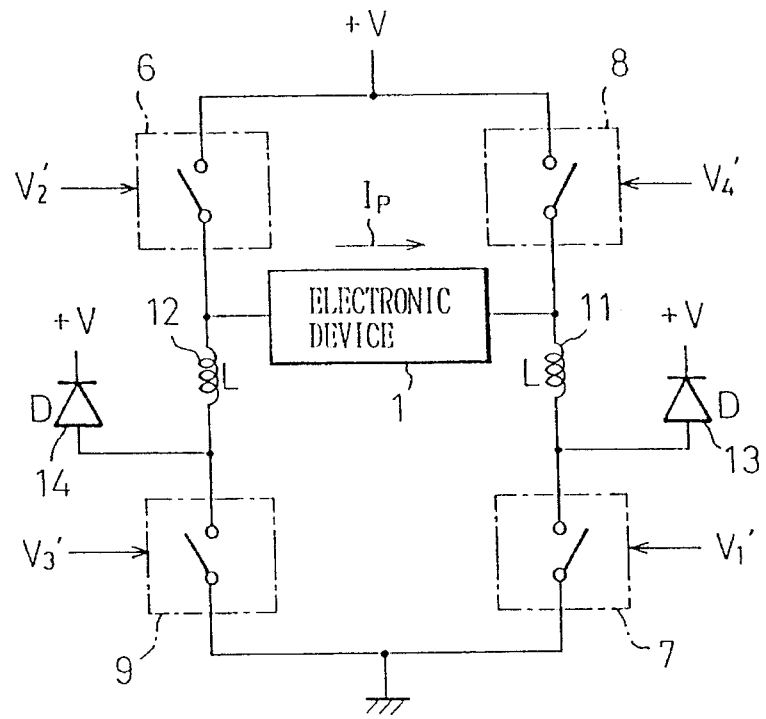
FIG. 18A is a circuit diagram showing a modification of the drive circuit of FIG. 16.
Figure 18B:
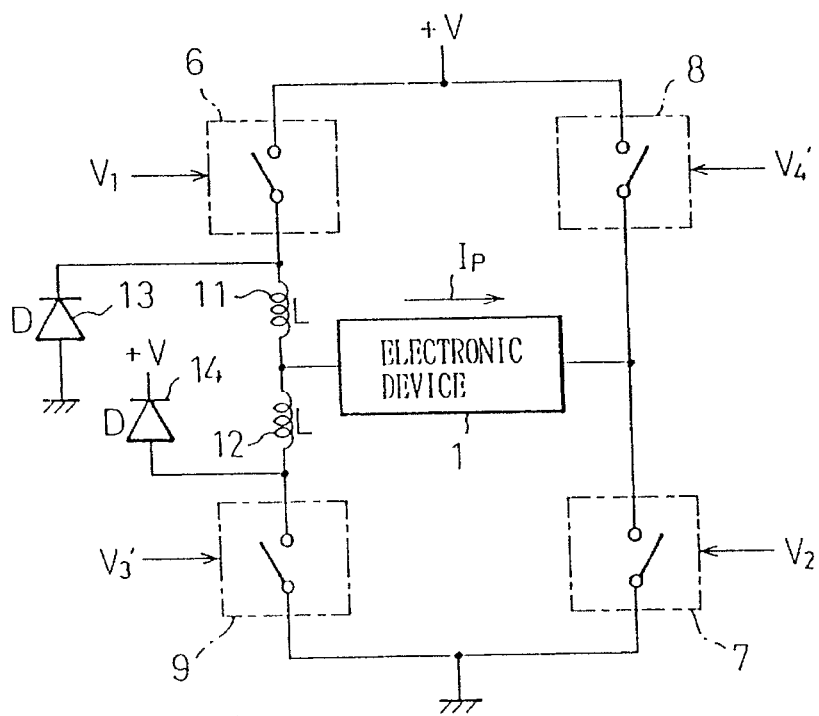
FIG. 18B is a circuit diagram showing another modification of the drive circuit of FIG. 16.

FIGS. 18A and 18B show modifications of the fifth embodiment. In FIG. 18A, the switching of FETs 7 and 9 is controlled, and in FIG. 18B, the switching of FETs 6 and 9 is controlled.

In FIG. 18A, the FET 7 is turned ON with a FET 6 being ON, and a drive current $I_P$ flows in a forward direction through an electronic device 1 via an inductor 11. When the FET 7 is turned OFF, the inductor 11 discharges accumulated energy, so that the drive current $I_P$ continuously flows in the forward direction through the electronic device 1 via a catch diode 13.

When the FET 9 is turned ON with a FET 8 being ON, the drive current $I_P$ flows in a reverse direction through the electronic device 1 via an inductor 12. When the FET 9 is turned OFF, the inductor 12 discharges accumulated energy, so that the drive current $I_P$ continuously flows in the reverse direction through the electronic device 1 via a catch diode 14.

In FIG. 18B, the FET 6 is turned ON with a FET 7 being ON, and a drive current $I_P$ flows in a forward direction through an electronic device 1 via an inductor 11. When the FET 6 is turned OFF, the inductor 11 discharges accumulated energy, so that the drive current $I_P$ continuously flows in the forward direction through the electronic device 1 via a catch diode 13.

When the FET 9 is turned ON with a FET 8 being ON, the drive current $I_P$ flows in a reverse direction through the electronic device 1 via an inductor 12. When the FET 9 is turned OFF, the inductor 12 discharges accumulated energy, so that the drive current $I_P$ continuously flows in the reverse direction through the electronic device 1 via a catch diode 14.

In this way, the fifth embodiment allows various modifications.

FIG. 19 shows a drive circuit according to the sixth embodiment of the present invention. This drive circuit involves an inductor (L) 15 and catch diodes (Ds) 16 and 17.

When a FET 6 is turned ON with a FET 7 being ON, a drive current $I_P$ flows in a forward direction through a Peltier element 1 via the inductor 15. When the FET 6 is turned OFF, the inductor 15 discharges accumulated energy, so that the drive current $I_P$ continuously flows in the forward direction through the Peltier element 1 via the catch diode 16.

When a FET 8 is turned ON with a FET 9 being ON, the drive current $I_P$ flows in a reverse direction through the Peltier element 1 via the inductor 15.

When the FET 8 is turned OFF, the inductor 15 discharges accumulated energy, so that the drive current $I_P$ continuously flows in the reverse direction through the Peltier element 1 via the catch diode 17.

The sixth embodiment employs only one coil, to simplify the drive circuit and improve the space factor thereof, compared with the fifth embodiment.

Figure 20:
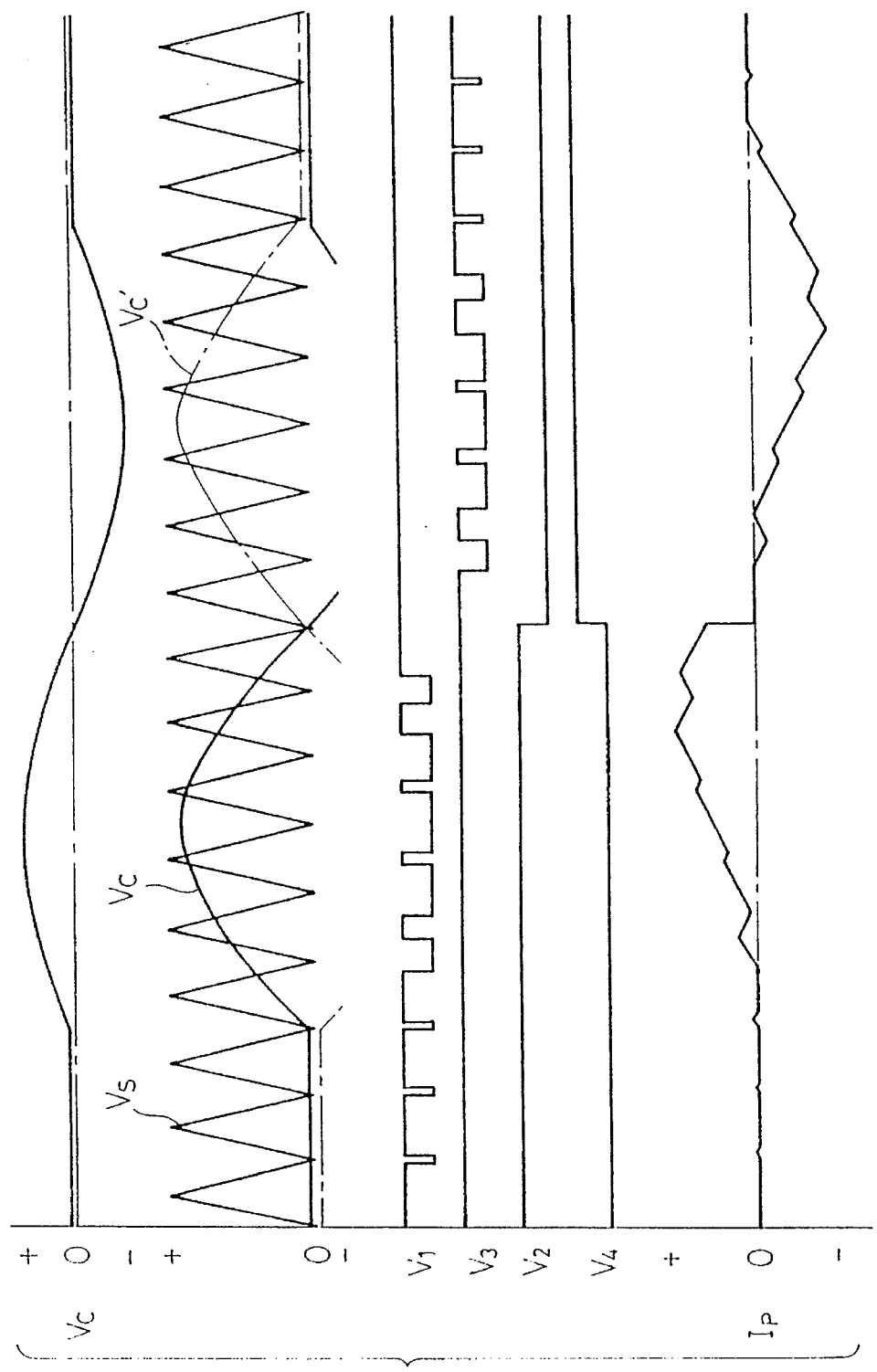
FIG. 20 is a timing chart showing an operation of the drive circuit of FIG. 19.

FIG. 20 is a timing chart showing the operation of the drive circuit of the sixth embodiment. The operation of the control circuit 10 of this embodiment is the same as that of the fourth embodiment. According to the sixth embodiment, the drive current $I_P$ continuously flows through the Peltier element 1 in the forward or reverse direction even after the FET 6 or 8 is turned OFF, to smooth the drive current Ip.

Figure 21A:
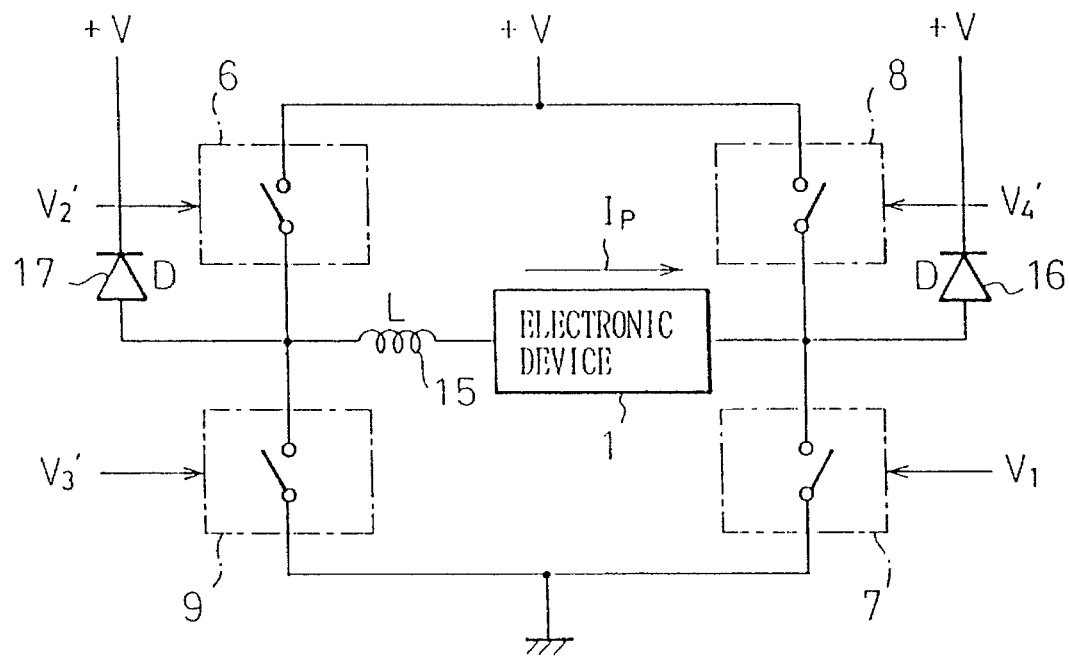
FIG. 21A is a circuit diagram showing a 10 modification of the drive circuit of FIG. 19.
Figure 21B:
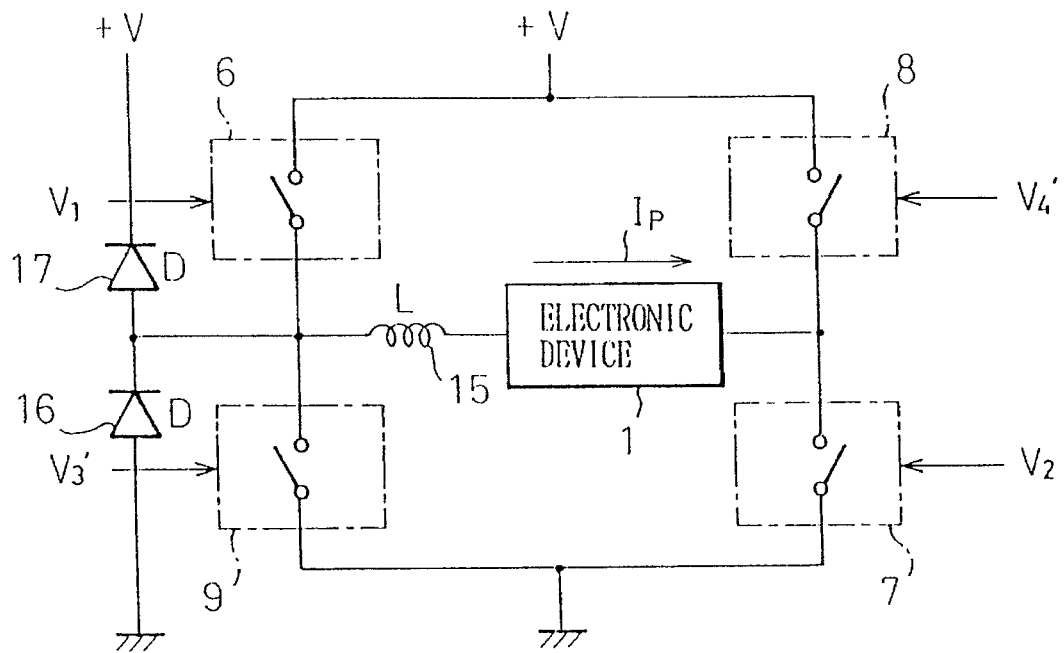
FIG. 21B is a circuit diagram showing another modification of the drive circuit of FIG. 19.

FIGS. 21A and 21B show modifications of the sixth embodiment. In FIG. 21A, the switching of FETs 7 and 9 is controlled, and in FIG. 21B, the switching of FETs 6 and 9 is controlled.

In FIG. 21A, the FET 7 is turned ON with a FET 6 being ON, and a drive current $I_P$ flows in a forward direction through an electronic device 1 via an inductor 15. When the FET 7 is turned OFF, the inductor 15 discharges accumulated energy, so that the drive current $I_P$ continuously flows in the forward direction through the electronic device 1 via a catch diode 16.

When the FET 9 is turned ON with a FET 8 being ON, the drive current $I_P$ flows in a reverse direction through the electronic device 1 via the inductor 15. When the FET 9 is turned OFF, the inductor 15 discharges accumulated energy, so that the drive current $I_P$ continuously flows in the reverse direction through the electronic device 1 via a catch diode 17.

In FIG. 21B, the FET 6 is turned ON with a FET 7 being ON, and a drive current $I_P$ flows in a forward direction through an electronic device 1 via an inductor 15. When the FET 6 is turned OFF, the inductor 15 discharges accumulated energy, so that the drive current Ip continuously flows in the forward direction through the electronic device 1 via a catch diode 16.

When the FET 9 is turned ON with a FET 8 being ON, the drive current Ip flows in a reverse direction through the electronic device 1 via the inductor 15. When the FET 9 is turned OFF, the inductor 15 discharges accumulated energy, so that the drive current $I_P$ continuously flows in the reverse direction through the electronic device 1 via a catch diode 17.

In this way, the sixth embodiment allows various modifications.

Although the third to sixth embodiments provide a PWM signal according to the input analog control voltage Vc, they may provide a PFM signal. Alternatively, they may change the power source voltage +V according to the control voltage $V_C$, to provide a PAM signal.

Any one of the drive circuits of the present invention may be assembled into a feedback loop, which provides constant light or heat output.

As explained above, a drive circuit according to the present invention has a switch 2 connected to an electronic device 1 in series, and a control circuit 3 for controlling the switch 2 with a pulse modulation signal in response to an input control signal CS, the frequency of the pulse modulation signal being higher than the response frequency of the electronic device 1. This drive circuit is compact and works on small power.

Another drive circuit according to the present invention has first to fourth switches 6 to 9 disposed on both sides of an electronic device 1 so that a current may flow in both directions through the electronic device 1, and a control circuit 10 for controlling the switches 6 to 9, to change the direction and magnitude of the average of the current flowing through the electronic device 1, in response to an input control signal CS. This drive circuit is compact, works on a low voltage, consumes low power, and is applicable for an electronic device that works with a bidirectional current.

We claim:

1. A drive circuit for an electronic device, comprising:

the electronic device for converting electric power into light or heat energy;

first, second, third, and fourth switches disposed on both sides of the electronic device, for passing a drive current in different directions through the electronic device; and a control circuit for controlling the switches to change the direction and magnitude of the average of the drive current flowing through the electronic device in response to an input control signal, the control circuit controlling the first to fourth switches such that the drive current flows in both directions through the electronic device according to a pulse modulation signal having a frequency is higher than the response frequency of the electronic device, the direction and magnitude of the average of the drive current being changed in response to the control signal.

2. The drive circuit according to claim 1, wherein the control circuit causes the drive current to flow in a forward or reverse direction through the electronic device in response to the control signal, and changes the magnitude of the average of the drive current by controlling the first and second, and third and fourth switches along a route for transmitting the drive current according to a pulse modulation signal whose frequency is higher than the response frequency of the electronic device.

3. The drive circuit according to claim 2, comprising:

inductors connected among the first or second and third or fourth switches in series; and catch diodes for feeding energy accumulated in the inductors back to a power source circuit along a route through the electronic device when the first and second and third and fourth switches are turned OFF.

4. The drive circuit according to claim 3, comprising:

an inductor connected at least to an end of the electronic device in series; and catch diodes for feeding energy accumulated in the inductor back to a power source circuit along a route through the electronic device when the first and second and third and fourth switches are turned OFF.

5. The drive circuit according to claim 1, wherein the electronic device is a Peltier element.

6. The drive circuit according to claim 1, wherein the pulse modulation signal is one of a PWM signal, a PFM signal, and a PAM signal.

* * * * *